United States Patent [19]
Williams

[11] Patent Number: 6,043,926
[45] Date of Patent: Mar. 28, 2000

[54] ELECTRO-OPTICAL BROADBAND MICROWAVE FREQUENCY SHIFTER

[75] Inventor: Keith J. Williams, Accokeek, Md.

[73] Assignee: The United States of America as represented by the Secretary of the Navy, Washington, D.C.

[21] Appl. No.: 08/827,518

[22] Filed: Mar. 28, 1997

[51] Int. Cl.$^7$ .............................. G02F 1/35; H01P 1/00
[52] U.S. Cl. ....................... 359/326; 333/167; 333/218; 385/1; 385/27
[58] Field of Search .................................. 333/167, 175, 333/176, 218; 359/326–332; 385/1–3, 15, 24, 27

[56] References Cited

U.S. PATENT DOCUMENTS

| | | | |
|---|---|---|---|
| 3,714,446 | 1/1973 | Kittredge | 250/219 D |
| 4,729,620 | 3/1988 | Pavlath | 350/96.15 |
| 4,754,227 | 6/1988 | Teague | 328/167 |
| 4,832,437 | 5/1989 | Kim et al. | 350/96.15 |
| 4,904,038 | 2/1990 | Chang | 350/96.14 |
| 4,962,316 | 10/1990 | Jack | 250/336.2 |
| 5,022,732 | 6/1991 | Engan et al. | 350/96.15 |
| 5,055,810 | 10/1991 | De La Chapelle et al. | 333/262 |
| 5,206,613 | 4/1993 | Collier et al. | 333/156 |
| 5,276,756 | 1/1994 | Chambers et al. | 385/90 |
| 5,375,182 | 12/1994 | Chambers et al. | 385/49 |
| 5,422,972 | 6/1995 | Chambers et al. | 385/90 |

OTHER PUBLICATIONS

Cumming, The Serrodyne Frequency Translator, Pro. 1 IRE, vol. 45, No. 2, pp. 175–186, 1957 (Feb.).

Klein et al., The Digilator, A New Broadband Microwave Frequency Translator, IEEE Trans. on Microw. Theo. and Techn., vol. MTT–15, No. 3, pp. 172–179, 1967 (Mar.).

Dakin et al., A Fibre Optic Serrodyne Frequency Translator Based on a Piezoelectrically–Strained Fibre Phase Shifter, IEE proc, vol. 132., pt. j. No. 5, pp. 287–290, 1985 (Oct.).

Johnson et al., Serrodyne Optical Frequency Translation With High Sideband Suppression, j. of Lightwave Tech., vol. 6, No. 1, pp. 109–112, 1988 (Jan.).

Williams et al., Interferometric Measurement of Low–Frequency Phase Noise Characteristics of Diode Laser–Pumped Nd:YAG Ring Laser, Elec. Ltr., vol. 25, No. 12, pp. 774–775, 1989 (Jun.).

Williams et al., 6–34 GHz Offset Phase–Locking of Nd:YAG 1319nm Nonplanar Ring Lasers, Elec. Ltrs., vol. 25, No. 18, pp. 1242–1243, 1989 (Aug.).

Dexter et al., Comparison of Fiber–Optic and a P–1–N Diode RF Phase Shifter, NRL–FR–5715–95–9759, pp. 1–21, 1995 (Sep.).

*Primary Examiner*—John D. Lee
*Attorney, Agent, or Firm*—Charles J. Stockstill; Thomas E. McDonnell

[57] ABSTRACT

The broadband microwave frequency shifter is an electro-optical device that accomplishes frequency shifting, or translation by the use of serrodyning or mixing techniques. A first optical signal is modulated with the radio frequency signal desired to be translated and processed to produce an upconverted lower sideband optical signal. A second optical signal is frequency shifted using an optical phase shifter utilizing serrodyning techniques or by offset phase locking it to another optical signal. When the frequency shifted optical signal is combined with the upconverted optical signal and converted to an output radio frequency signal thereby producing an output microwave signal that duplicates the input microwave signal in all aspects except that its center frequency has been shifted.

16 Claims, 6 Drawing Sheets

ELECTRO-OPTICAL BROADBAND MICROWAVE FREQUENCY SHIFTER

BACKGROUND OF THE INVENTION

1. Field of the Invention

This invention provides, generally, an apparatus and method for arbitrarily shifting the frequency of an incoming electromagnetic signal. More specifically, this invention pertains to the use of an optical source to up-convert, filter, and downconvert an input electromagnetic signal in the microwave spectrum to shift the frequency of the electromagnetic signal that is output.

2. Description of the Related Art

Currently microwave frequency shifters rely primarily on digital phase shifters for creating a serrodyne modulation format which results in a one-directional frequency shift, or the use of image rejection mixers which divide, modulate and recombine the signal, with the undesirable components (sidebands and carrier) removed by coherent cancellation. In the case of the digital phase modulator, the achievable image and carrier rejection is limited by the number of discrete bits that can be implemented in hardware, usually less than ten. This limits the achievable rejection to below 25 dB. In the case of the image rejection mixer, the achievable image and carrier rejection is limited by the ability to create two broadband microwave signals exactly 90° out of phase with exactly the same amplitude (independent of the incoming frequency). Typical devices with 3° phase error and a 0.25 dB amplitude imbalance are limited in their image and carrier rejection to 30 dB.

A summary of image rejection versus phase and amplitude imbalance is shown in FIG. 1. Note that the phase error of less than 1+ with no amplitude error is necessary for greater than 40 dB rejection. Further details of Serrodyne modulation is to be found in Klein et al.; *The DIGILATOR, a New Broadband Microwave Frequency Translator;* IEEE Transactions on Microwave Theory and Technology; Vol MTT-15, No. 3; pp. 172–179; March 1967; Cummings, *The Serrodyne Frequency Translator;* Proceedings of the IRE; Vol. 45, No. 2; pp. 195-186; February 1957; Thylen et al.; *Electro-Optical Serrodyne Frequency Translator for* $\lambda$=1.3 $\mu m$; IEEE Proceedings, Vol. 132 Pt.J, No. 2; pp. 119–121; April 1985; Johnson et al.; *Serrodyne Optical Frequency Translation with High Sideband Suppression;* Journal of Lightwave Technology; Vol. 6, No. 1; pp. 109–112; January 1988; and further details of image rejection mixers can be found in the commercial literature of Merrimac Industries, West Caldwell, N.J. for the Model Numbers SSF-2; SSP-1R, SSF-1E, SSP-2, SSM Series and SSB Series Single sideband modulators.

In general, electrical frequency shifters can operate only over a very narrow bandwidth due to engineering complexities. In the case of the single-sideband mixer, it becomes very difficult to phase and amplitude match over a broad bandwidth, therefore the presently available devices are usually limited to instantaneous bandwidths of less than 1–2 octaves at microwave frequencies. In the digital phase shifter, the trade off between creating many bits for good rejection is not compatible with broadband operation because of the many paths the signal takes, therefore the current devices are usually limited to instantaneous bandwidths of less than 12 GHz.

The fundamental ideas used in this invention of up-converting, filtering and downconverting to shift the microwave frequency has been achieved by the use of all-microwave components, as shown in FIG. 2. An incoming microwave signal, $f_{sig}$, 12 is mixed with a microwave oscillator 14 having a frequency, $f_{lock}$, in an up-converting double balanced mixer. The positive frequency component (upper sideband, USB) of the incoming signal 12 is frequency converted to $f_{lock}+f_{sig}$ and the negative frequency component (lower sideband,LSB) of the incoming signal 12 is frequency converted to $f_{lock}-f_{sig}$. An electrical filter 18 attenuates either the shifted LSB or the shifted USB, as well as the incoming signal 12 and the mixing frequency, $f_{lock}$. After mixing in the mixer 16, only the wanted (shifted) single sideband at the IF input, I, is applied to a downconverting mixer 22. A signal generated by a second oscillator 24, $f_a$, is mixed with the shifted sideband in the mixer 22 to produce a signal with a new frequency $f_a-(f_{lock}-f_{sig})$, where the LSB is used without loss of generality. If $F_a-f_{lock}$ is nonzero (if the oscillator at the frequency $f_a$ has a slightly different frequency than $f_{lock}$), the resulting signal at $f_{sig}$ is shifted by $f_a-f_{lock}$. An example is where a 10.5 GHz input signal frequency is mixed with a 12 GHz oscillator to create frequencies of 1.5 and 22.5 GHz. A 5 GHZ low pass filter removes the original 10.5 GHz signal, the 12 GHz local oscillator and the 22.5 GHz shifted USB, leaving only the shifted LSB. The shifted LSB at 1.5 GHz is then upconverted in a second mixed with a 12 GHZ+500 Hz oscillator to a net shifted output frequency of 10.5 GHz+500 Hz. The results of this is shown in FIG. 3. If a traditional serrodyne or image rejection mixer were used there would be unwanted signals (images) at 10.5 GHz±(n+1)*500 Hz, where n is a nonzero integer. The 63 dB carrier rejection and approximately 60 dB of image and spurious rejection shown in FIG. 3 is possible since the level of image and carrier rejection is determined by the level of filtering used between the mixers, this may be very high (>100 dB). The drawback of all the microwave technique presented above is that to achieve wideband operation, a mixer with wide bandwidths on all three ports is required. Additionally, the intermodulated distortion products of electrical mixers are quite high and can lead to significant signal distortion.

This invention presents an apparatus and technique to obtain a frequency shifted microwave signal by utilizing electrically controlled optical phase shifters to create a serrodyne modulation or multiple offset-phase-locked lasers to shift the microwave signal to a new frequency. This results in an improved image and carrier rejection when compared to electrical techniques.

SUMMARY OF THE INVENTION

The object of this invention is to provide an apparatus and method for arbitrarily shifting the frequency of an incoming microwave signal with large instantaneous bandwidth.

Another object of this invention is to provide an improved output image and carrier rejection that will allow many microwave signal processing functions.

These objectives are achieved by the broadband microwave frequency shifter which is a electro-optical device that accomplishes frequency shifting, or translation, in one embodiment, by the use of serrodyning techniques, with a plurality of optical signals. A first optical signal is modulated with the radio frequency signal desired to be translated and processed to produce an upconverted lower sideband optical signal. A frequency shifted optical signal is generated by either using an optical phase shifter utilizing serrodyning techniques to frequency shift a second optical signal or by offset-phase-locking a third optical signal to an upshifted second optical signal. When the frequency shifted optical signal is combined with the first optical signal, which is amplified modulated by the upconverted input radio signal, it is converted to an output radio frequency signal thereby producing an output microwave signal that duplicates the input microwave signal in all aspects except that its center frequency has been shifted.

DESCRIPTION OF THE PREFERRED EMBODIMENT

Figure 1:
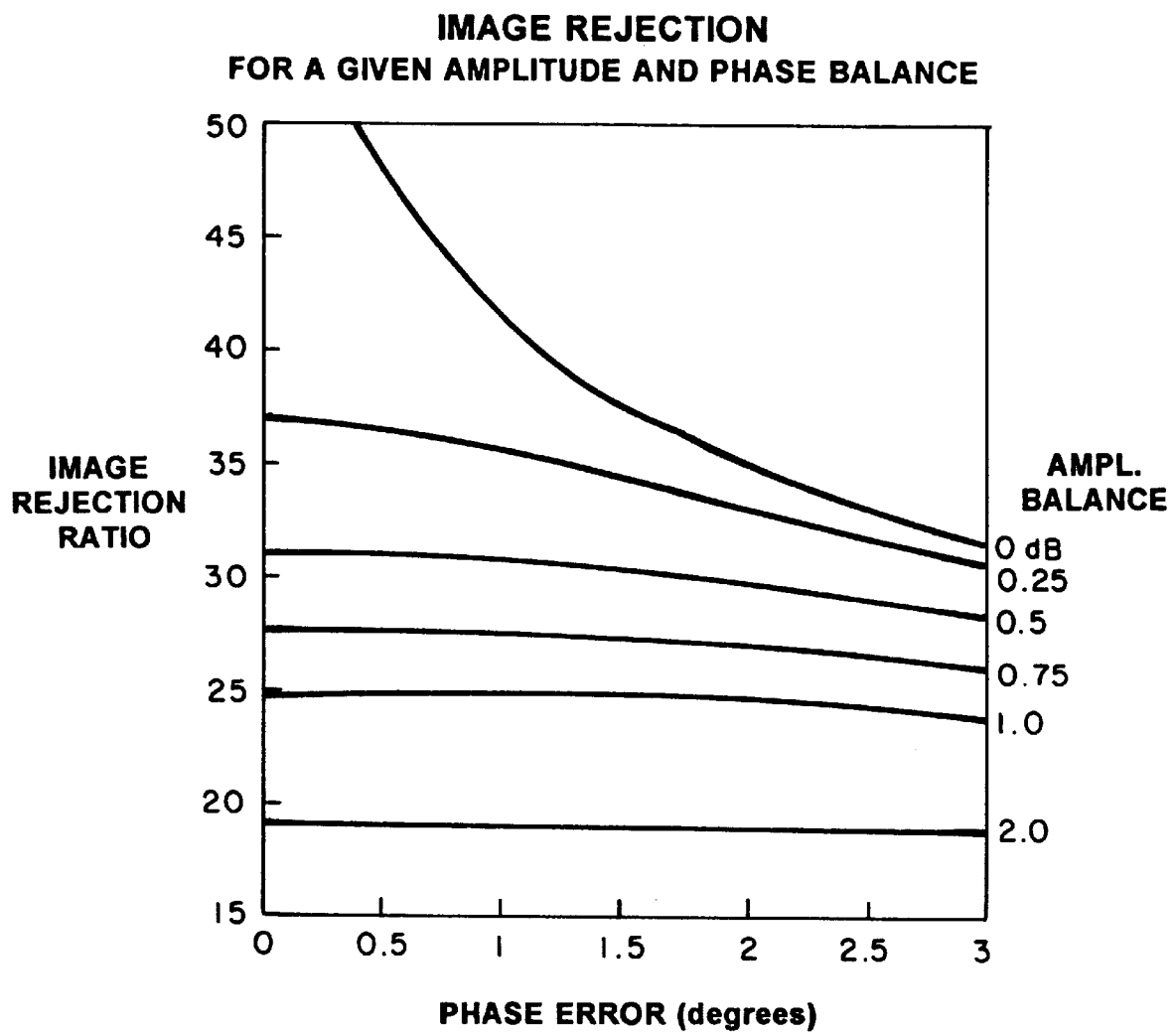
FIG. 1 shows a plot of image rejection for a given phase and amplitude imbalance.
Figure 2:
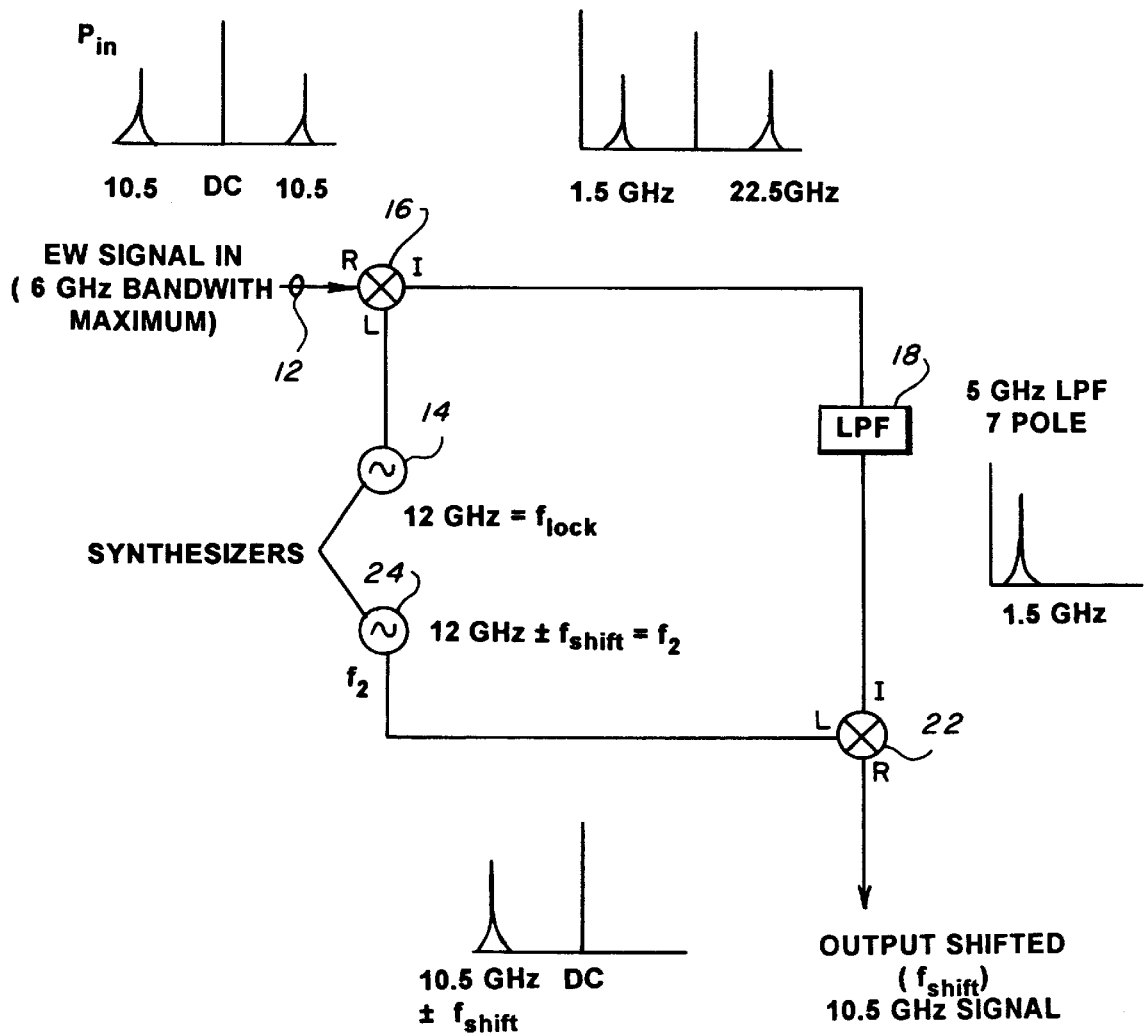
FIG. 2 shows a typical microwave equivalent frequency shifter.
Figure 3:
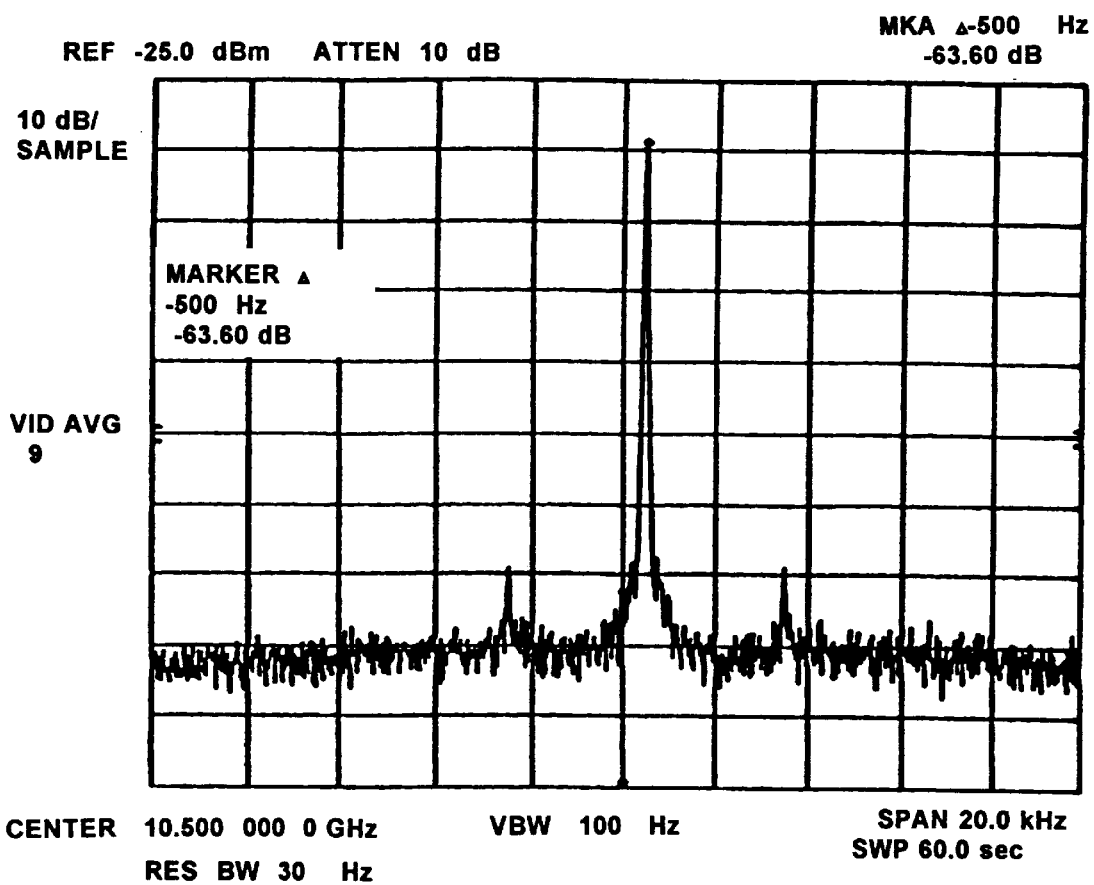
FIG. 3 shows the typical performance of the microwave equivalent frequency shifter.
Figure 4:
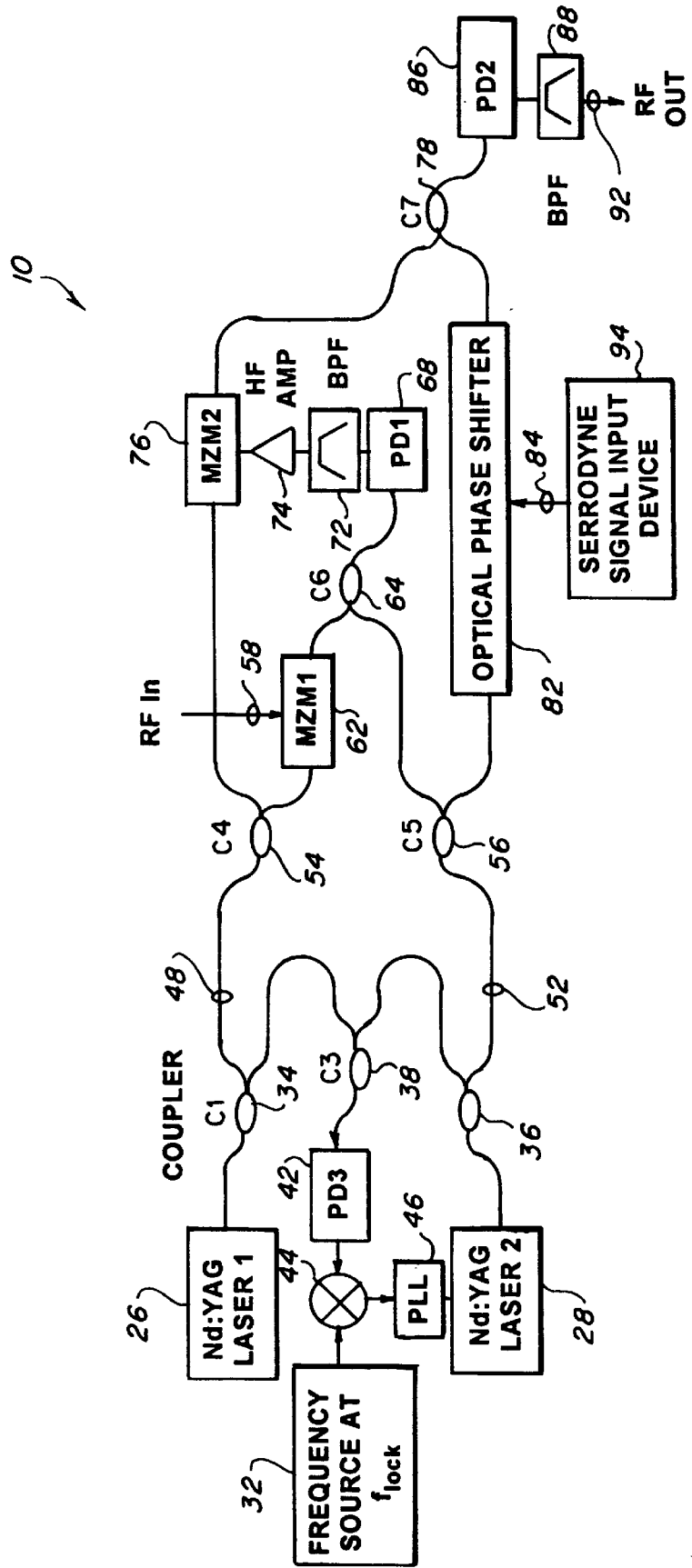
FIG. 4 shows a basic optical configuration for implementing wideband optical serrodyne microwave frequency shifting.

In the basic configuration of the preferred embodiment for implementing wideband optical microwave frequency shifter 10, as shown in FIG. 4, where two phase-lockable lasers 26 and 28 are used to generate optical signals. Preferably, these lasers 26 and 28 are Nd:YAG lasers, however, other laser types may be utilized.

A first portion of the optical signal generated by the first laser 26 output is applied to a second coupler 38 from a first coupler 34. A first portion of the optical signal from the second laser 28 is also applied to the second coupler 38 from a third coupler 36 to produce a combined optical signal output. This combined optical signal is incident on a first photodetector 42 which converts it to an output radio frequency (RF) signal producing the laser offset locking frequency. This signal is fed back to the second laser 28, after mixing in mixer 44 with a sinusoidal frequency source 32 oscillating at the locking frequency, $f_{lock}$, from an external sinusoidal frequency source 32. The output of the mixer 44 is the phase error between the laser RF beatnote, or laser offset locking frequency, and the frequency source 32. This signal phase locks the phases of the two lasers 26 and 28 to the sinusoidal frequency source 32 through a phase lock loop 46.

Figure 5A:
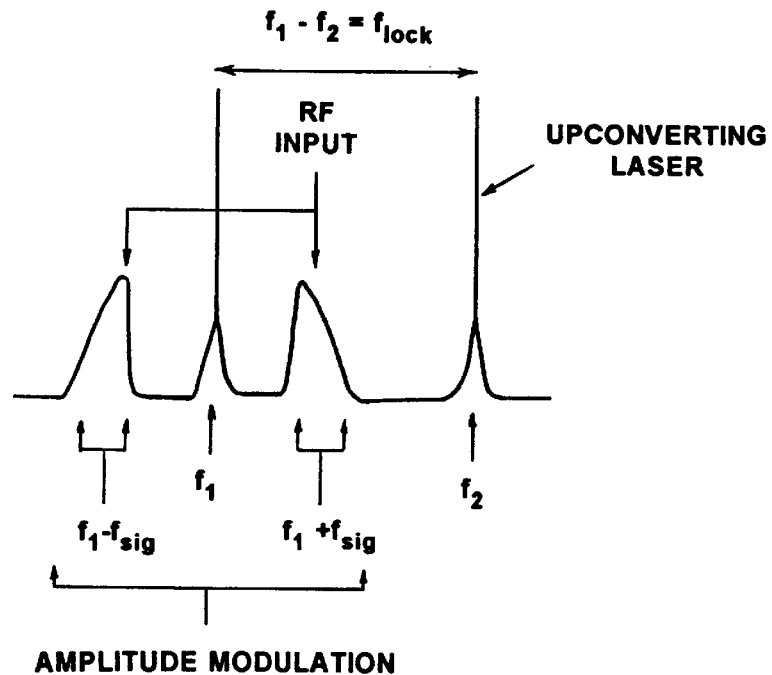
FIG. 5a shows combined AM optical signal as a result of the mixing products between the amplitude modulated first laser and the continuous wave (CW) second laser of the wideband optical serrodyne microwave frequency shifter before photodetection and subsequent filtering by a bandpass filter.
Figure 5B:
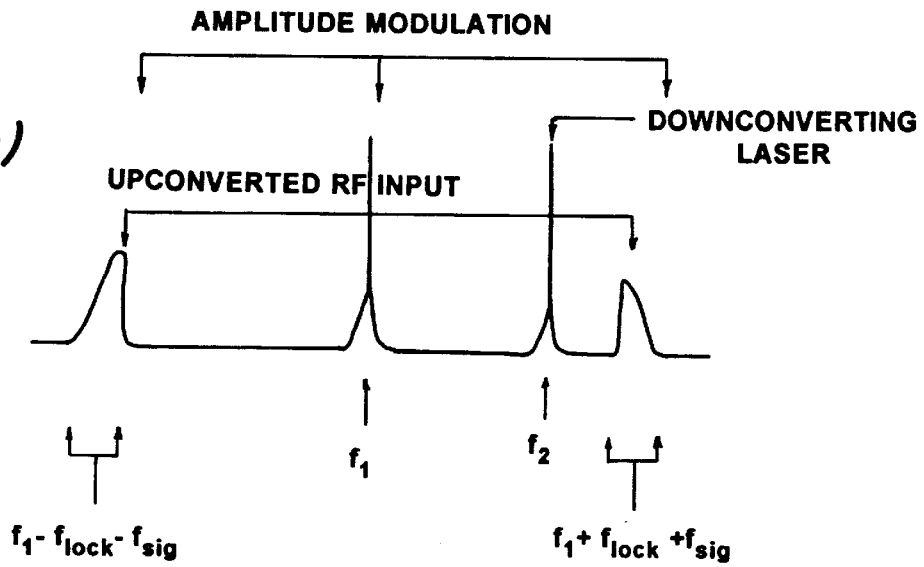
FIG. 5b shows the combined AM optical signal as the result of the mixing products between the amplitude modulation first laser (modulated with the upconverted RF signal) and the continuous wave (CW) second laser(phase modulated by the optical phase modulator with serrodyne signal input) of the wideband optical serrodyne microwave frequency shifter before photodetection and subsequent filtering by a bandpass filter.

The second output of the first optical coupler 34 and the second optical coupler 36 are further divided into two approximately equal parts by a fourth and fifth optical coupler 54 and 56, respectively. A first output of the fourth optical coupler 54 is amplitude modulated (AM) in a optical modulator 62, preferably a Mach-Zehnder, with an RF signal 58 to be translated, $f_{RF}$, and combined with a first output of the fifth optical coupler 56 to produce a combined amplitude modulated optical signal. The frequency components are shown in FIG. 5a, before photodetection and subsequent filtering by bandpass filter 72. The combined AM optical signal is applied to a second photodetector 68, the output of the which consists of the mixing products between the amplitude modulated first laser 26 and the continuous wave (CW) second laser 28.

The only requirement is that the laser offset locking frequency output by the photodetector 42 must be greater than the highest frequency component of the RF input signal 58 to be translated. The upper sideband of the RF input signal 58 is frequency down-shifted to $f_{lock}-f_{RF}$ and the lower sideband (LSB) of the RF input signal 58 is frequency upshifted to $f_{lock}+f_{RF}$. The RF output of the photodetector 68 consists of the unshifted RF signals from the amplitude modulated first laser 26, the CW tone at the locking frequency, $f_{lock}$, from the first laser 26 and second laser 28, and the up- and down-shifted sidebands of RF input signal 58. The upconverted LSB is the desired term which is filtered in a bandpass filter 72 and amplified in a high frequency (HF) amplifier 74. The up-shifted LSB is then used to amplitude modulate the second optical signal of the first laser 26 appearing at the second output of the third optical coupler in a second Mach-Zehnder modulator 76 which is applied to a sixth optical coupler 78.

The output of the second Mach-Zehnder modulator 76 is then combined with a processed signal of the optical output of the second laser 28. The processed signal of the second laser 28 is obtained by applying the second output of the third optical coupler 56 which appears as a second output of the fifth optical coupler 56 to an optical phase shifter 82.

By applying a serrodyne signal 84 from an external serrodyne signal input device 94 to the optical phase shifter 82, the frequency of the RF out of the third photodetector 86 can be shifted either up or down. The necessary optical phase shift to result in a $2\pi$ microwave phase shift for creating a frequency shift with high carrier and sideband rejection is only $2\pi$ radians at the optical frequency. The output of the optical phase shifter 82 is combined in the sixth optical coupler 78 with the output of the second Mach-Zehnder modulator 76 and applied to a third photodetector 86 producing an electrical signal which is filtered in a bandpass filter 88 to produce an output radio frequency signal 92 which is similar in all characteristics to the input radio frequency signal 58 except that its carrier frequency has been shifted.

No frequency shifting occurs when no external signal is applied to the optical phase shifter 82. In this condition, the RF output of the third photodetector 86 consists of the AM demodulated shifted signal from the amplitude modulated first laser 26 (via the second Mach-Zehnder modulator 76), the CW tone at the locking frequency from the first and second lasers 26 and 28, respectively, the frequency downshifted USB ($f_{lock}-(f_{lock}-f_{RF}))=f_{RF}$, and the up-shifted lower sideband (LSB) to $2*f_{lock}+f_{RF}$. The downconverted USB (the USB is the up-converted LSB from the output of the second photodetector 68) is the desired signal and is filtered out by the bandpass filter 88.

Figure 6:
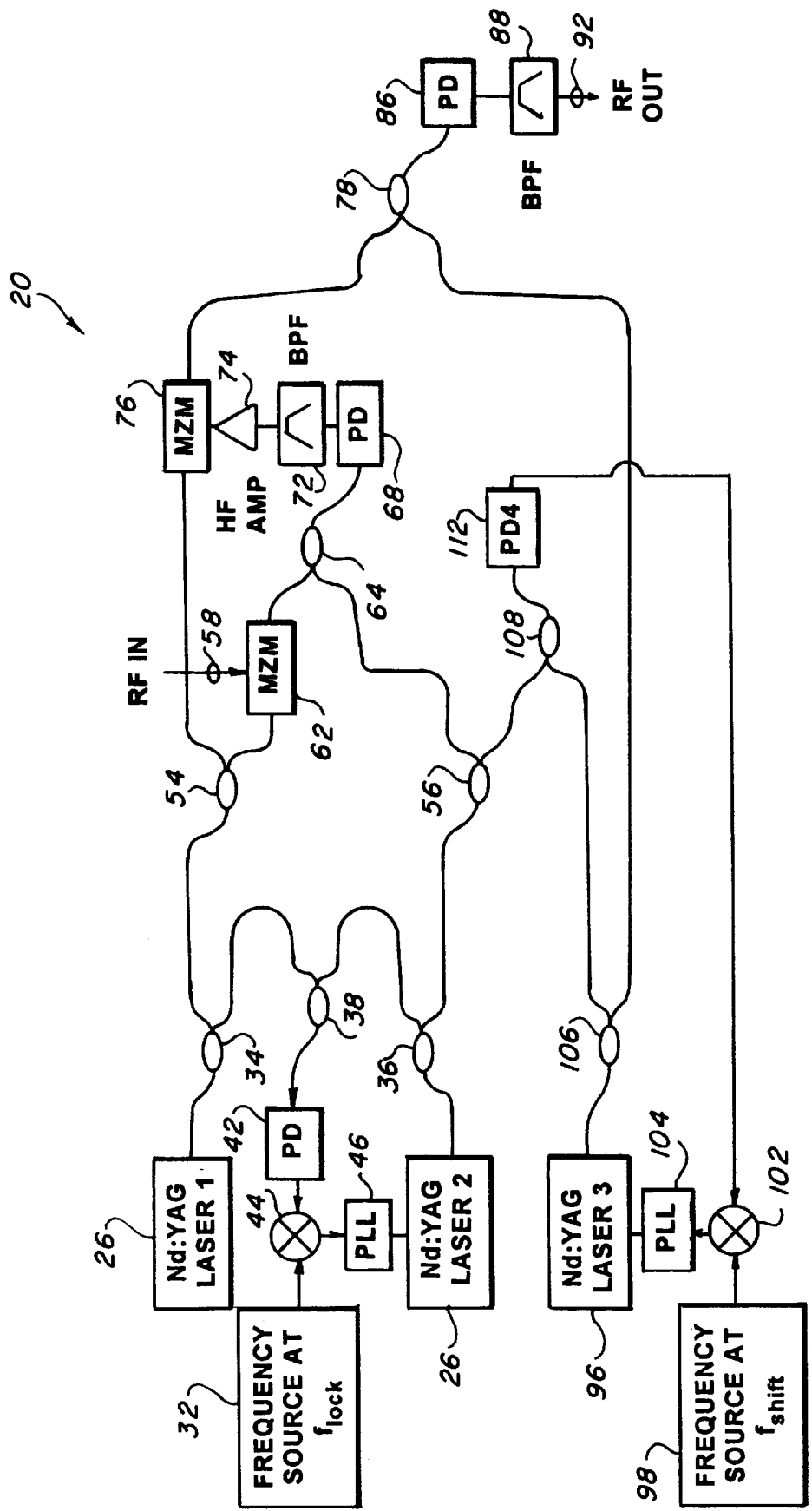
FIG. 6 shows a basic optical configuration for implementing wideband optical microwave frequency shifting utilizing three lasers.

The basic configuration of the microwave frequency shifter may be modified, as shown in another preferred embodiment 20, where even higher image and sideband rejection may be obtained with the addition of a third laser 96, as shown in FIG. 6. The first portion of an optical signal from the third laser 96 from optical coupler 106 is combined with a portion of the optical signal from the second laser 26 in coupler 56 and the combined optical signal is converted to an electrical signal in a photodetector 112 and phase locked to the second laser 26 by the desired frequency shifting amount, $f_{shift}$, from an external frequency source 98, through a mixer 102 and phase locked loop 104.

The upconverted lower sideband output from photodetector 68 is the same as described in the previous embodiment and is the desired term to be filtered in bandpass filter 72 and amplified in high frequency amplifier 74. This signal modulates the first laser 26 as in the first embodiment, however, in this embodiment, the output of modulator 76 is combined with the third laser 96. The upconverted lower sideband at frequency ($f_{lock}+f_{sig}$) is downshifted to ($f_{sig}+f_{shift}$) or ($f_{sig}-f_{shift}$) depending on whether the third laser 96 frequency is higher or lower than that of the second laser 28. This embodiment improves the sideband and carrier rejection because it replaces the serrodyne shifted second laser 28 (which has a residual carrier and many unwanted sidebands) with another single frequency laser 96 which tracks the frequency of the second laser 28 (by an offset frequency $f_{shift}$) by a phase locked loop.

Basically, this embodiment replaces the serrodyne shifted second laser 28 with a third laser 96 offset in frequency (via offset phase locking) from the second laser 28 frequency. (Serrodyning being a technique for shifting the frequency of a laser or microwave signal.) The technique in this embodiment has a better performance than the serrodyne technique because the serrodyne technique creates unwanted residual carrier and sidebands besides the shifted frequency component. This is a consequence of the non-ideal serrodyne sawtooth waveform generation or modulation of the desired frequency.

The image rejection obtainable by this embodiment 20 is similar to the prior art all microwave frequency shifter, where the rejection is determined by the amount of filtering and not the purity of the serrodyne signal. However, this embodiment is limited in the speed at which the shifting frequency can be adjusted.

The devices described above provide a broadband instantaneous response limited only by ~½ the available optical modulator bandwidth and reduces the required optical phase shift for implementing Serrodyne modulation by greater than four orders of magnitude. Frequency shifting at gigahertz rates of two to four orders of magnitude greater than the prior art are produced by this techniques used in this device.

Although this invention has been described in relation to the specifically cited preferred embodiments thereof, it will be understood by those skilled in the art that still other variations and modifications can be affected in the preferred embodiments without detracting from the scope and spirit of the invention as described by the claims.

What is claimed is:

1. A microwave frequency shifter comprised of:
    a plurality of optical signals;
    means for modulating a first and second portion of a first optical signal of the plurality of optical signals with an input radio frequency signal having identifiable characteristics to produce a modulated output optical signal having a carrier with an upper and lower sideband at the upconverted lower sideband frequency;
    means for producing a second output optical signal with the center frequency translated of at least one of the plurality of optical signals;
    means for combining the first and second output optical signals so as to produce a processed optical signal; and
    means for converting the processed optical signal into an output radio frequency signal having the same characteristics as an input optical signal but having a shifted center frequency.

2. A microwave frequency shifter comprised of:
    a plurality of optical light sources for generating a plurality of optical signals;
    means for phase locking the phases of the plurality of optical signals;
    means for dividing the optical signal of a first optical light source of the plurality of optical light sources into a first and a second output optical signal;
    means for dividing the optical signal of a second optical light source of the plurality of optical light sources into a third and fourth output optical signal;
    means for modulating a first portion of the first output optical signal with an input radio frequency signal having identifiable characteristics to produce a modulated optical signal;
    means for combining the modulated optical signal and a first portion of the third output optical signal to produce a mixed optical signal output having a carrier with upper and lower sidebands imposed thereon;
    means for converting the mixed optical signal output into an electrical signal having a carrier with upper and lower sidebands imposed thereon;
    means for filtering the electrical signal to produce a first processed electrical signal, said signal having an upconverted lower sideband;
    means for modulating a second portion of the first output optical signal with the upconverted lower sideband to produce a first processed optical signal having a carrier with an upper and lower sideband at the upconverted lower sideband frequency;
    means for phase shifting a first portion of the third optical signal to produce a second processed optical signal whose frequency is different from the third optical signal;
    means for combining the first processed optical signal and second processed optical signal to produce final output optical signal; and
    means for converting the final output optical signal into an output radio frequency signal having the same characteristics as the input radio frequency signal but with the center frequency shifted.

3. A microwave frequency shifter, as in claim 2, wherein the optical light source is a laser.

4. A microwave frequency shifter, as in claim 3, wherein said laser is a ND:YAG laser.

5. A microwave frequency shifter, as in claim 2, wherein the means for phase locking the phases of the plurality of optical signals is a phased lock loop.

6. A microwave frequency shifter, as in claim 2, wherein the means for modulating the first output optical signal with an input radio frequency signal having identifiable characteristics to produce a modulated optical signal is an optical modulator.

7. A microwave frequency shifter, as in claim 2, wherein the means for converting the mixed optical signal output into an electrical signal having a carrier with upper and lower sidebands imposed thereon is a photodetector.

8. A microwave frequency shifter, as in claim 2, wherein the means for modulating a second portion of the first output optical signal with the upconverted electrical signal to produce a first processed optical signal having a carrier with an upconverted lower sideband optical signal is an optical modulator.

9. A microwave frequency shifter, as in claim 2, further comprising means for phase shifting a second portion of the fourth optical signal to produce a third processed optical signal whose frequency is different from the fourth optical signal and which is comprised of an optical phase shifter and a serrodyne signal input device.

10. A microwave frequency shifter, as in claim 2, wherein the means for converting the final output optical signal into an output radio frequency signal having the same characteristics as the input radio frequency signal but with the center frequency shifted is a photodetector.

11. A microwave frequency shifter comprised of:

a plurality of optical light sources for generating a plurality of optical signals;

a phase lock loop for synchronizing the phases of the plurality of optical signals comprised of the combination of a portion of the optical signals from a first and second optical light source, conversion of the combined optical signal into an electrical signal, the mixing of the combined electrical signal with a sinusoidal radio frequency source oscillating at a predetermined locking frequency to produce an output electrical signal which contains a phase error between the electrical signal of the optical signal and the frequency source, and a phased locked loop circuit for locking the phases of the first and second optical light source;

an optical coupler for dividing the optical signal of the first optical light source into a first and a second output optical signal;

an optical coupler for dividing the optical signal of the second optical light source into a third and fourth output optical signal;

an optical modulator for modulating a first portion of the first output optical signal with an input radio frequency signal having identifiable characteristics to produce a modulated optical signal;

an optical coupler for combining the modulated optical signal with a first portion of the third output optical signal to produce a mixed optical signal output having a carrier with upper and lower sidebands imposed thereon;

a photodetector for converting the mixed optical signal output into an electrical signal having a carrier with upper and lower sidebands imposed thereon;

a bandpass filter for filtering the electrical signal to produce a first processed electrical signal, said signal having an upconverted lower sideband;

an optical modulator for modulating a second portion of the first output optical signal with the upconverted lower sideband to produce a first processed optical signal having a carrier with an upper and lower sideband at the upconverted lower sideband frequency;

an optical phase shifter for phase shifting a second portion of the third output optical signal to produce a second processed optical signal whose frequency is different from the third output optical signal by applying a serrodyned signal from an external serrodyne signal input device to the optical phase shifter;

an optical coupler for combining the first processed optical signal and second processed optical signal to produce a final output optical signal; and a photodetector for converting the final output optical signal into an output radio frequency signal having the same characteristics as the input radio frequency signal but with the center frequency shifted.

12. A microwave frequency shifter comprised of:

a plurality of optical signal generators for generating a plurality of optical signals;

means for offset phase locking the phases of the plurality of optical signals;

means for dividing the optical signal of a first optical signal generator of the plurality of optical signal generators into a first and a second output optical signal;

means for dividing the optical signal of a second optical signal generator of the plurality of optical signal generators into a third and fourth output optical signal;

means for dividing the optical signal of a third optical signal generator of the plurality of optical signal generators into a fifth and sixth output optical signal;

means for modulating the first output optical signal with an input radio frequency signal to produce a first modulated optical signal;

means for combining the modulated optical signal with the third output optical signal to produce a mixed optical signal output having a carrier with upper and lower sidebands imposed thereon;

means for converting the mixed optical signal output into an electrical signal having a carrier with upper and lower sidebands imposed thereon;

means for filtering the electrical signal to produce a first processed electrical signal, said signal having an upconverted lower sideband;

means for modulating the second output optical light with the upconverted lower sideband to produce a first processed optical signal having a carrier with an upper and lower sideband at the upconverted lower sideband frequency;

means for combining the fourth optical signal with the fifth optical signal to produce a combined optical signal which is converted into a combined electrical signal;

means for mixing the combined electrical signal with a predetermined shifting frequency from a frequency source that is applied to a phase locked loop, the output of which is applied to a third signal generator to vary the frequency of the optical signal generated by the third signal generator;

means for combining the first processed optical signal and the sixth optical signal to produce a final output optical signal;

means for converting the final output optical signal into an output radio frequency signal; and means for filtering the output radio frequency signal so that it has the same characteristics as the input radio frequency signal but with the center frequency shifted.

13. A method for shifting the frequency of a microwave signal comprised of the steps of:

producing a plurality of optical signals;

modulating a first optical signal of the plurality of optical signals with an input radio frequency signal to produce a modulated output optical signal;

producing a second output optical signal with the center frequency translated of at least one of the plurality of optical signals;

mixing the modulated optical signal with the second optical signal to produce a first output optical signal having an upconverted lower sideband;

combining the first and second output optical signals to produce a processed optical signal; and converting the processed optical signal to an output radio frequency signal having the same characteristics of at least one of the plurality of optical signals of the input optical signal but having a shifted center frequency.

14. A method for shifting the frequency of a microwave signal comprised of the steps of:

producing a plurality of optical signals from a plurality of optical light sources;

synchronizing the phases of the plurality of signals comprised of combining a portion of the optical signals from a first and second optical light source, converting the combined optical signal into an electrical signal, mixing the combined electrical signal with a sinusoidal radio frequency source oscillating at a predetermined locking frequency to produce an output electrical signal which contains a phase error between the electrical signal of the optical signal and the frequency source, and a phased locked loop circuit for locking the phases of the first and second optical light sources;

dividing a first optical light signal of the plurality of optical signals into a first and a second output optical signal;

dividing a second optical signal of the plurality of optical signals into a third and fourth output optical signal;

modulating a first portion of the first output optical signal with an input radio frequency signal having identifiable characteristics to produce a modulated optical signal;

combining the modulated optical signal with a first portion of the third output optical signal to produce a mixed optical signal output having a carrier with upper and lower sidebands imposed thereon;

converting the mixed optical signal output into an electrical signal having a carrier with upper and lower sidebands imposed thereon;

filtering the electrical signal to produce a first processed electrical signal, said signal having an upconverted lower sideband;

modulating a second portion of the first output optical signal with the upconverted lower sideband to produce a first processed optical signal having a carrier with an upconverted lower sideband optical signal imposed thereon;

shifting the phase of a second portion of the third optical signal to produce a second processed optical signal whose frequency is different from the second portion of the third output optical signal by applying a serrodyned signal from an external serrodyne signal input device to an optical phase;

combining the first processed optical signal and second processed optical signal to produce a final output optical signal; and converting the final output optical signal into an output radio frequency signal having the same characteristics as the input radio frequency signal but with the center frequency shifted.

15. A microwave frequency shifter comprised of:

a plurality of optical light sources for generating a plurality of optical signals;

means for locking the phases of the plurality of optical signals;

an optical coupler for dividing a first optical signal of the plurality of optical signals into a first and second output optical signal;

an optical coupler for dividing a second optical signal of the plurality of optical signals into a third and fourth output optical signal;

an optical coupler for dividing a third optical signal of the plurality of optical signals into a fifth and sixth output optical signal;

an optical modulator for modulating a first portion of the first output optical signal with an input radio frequency signal having identifiable characteristics to produce a first modulated optical signal;

an optical coupler for combining the first modulated optical signal with a first portion of the third output optical signal to produce a mixed optical signal output having a carrier with upper and lower sidebands imposed thereon;

a photodetector for converting the mixed optical signal output into an electrical signal having a carrier with upper and lower sidebands imposed thereon;

a bandpass filter for filtering the electrical signal to produce a first processed electrical signal, said signal having an upconverted lower sideband;

an optical modulator for modulating a second portion of the first output optical signal with the first processed electrical signal to produce a first processed optical signal having a carrier with an upconverted lower sideband optical signal imposed thereon;

an optical coupler for combining a second portion of the third output optical signal with a first portion of the fifth output optical signal to produce a combined optical signal;

a photodetector for converting the combined optical signal into a combined electrical signal;

means for mixing the combined electrical signal with a predetermined shifting frequency from a frequency source that is applied to a phase locked loop and whose output is applied to a third optical source to vary the frequency of the optical signal generated by the third optical source;

a coupler for combining the first processed optical signal and the sixth output optical signal to produce a final output optical signal; and a photodetector for converting the final output optical signal to a radio frequency signal having the same characteristics as the input radio frequency signal but with the center frequency shifted.

16. A method for shifting the frequency of a microwave signal comprised of the steps of:

generating a plurality of optical signals;

locking the phases of the plurality of optical signals;

dividing a first optical signal of the plurality of optical signals into a first and a second output optical signal;

dividing a second optical signal of the plurality of optical signals into a third and fourth output optical signal;

dividing a third optical signal of the plurality of optical signals into a fifth and sixth output optical signal;

modulating a first portion of the first output optical signal with an input radio frequency signal having identifiable characteristics to produce a first modulated optical signal;

combining the first modulated optical signal with a first portion of the third output optical signal to produce a mixed optical signal output having a carrier with upper and lower sidebands imposed thereon;

converting the mixed optical signal output into an electrical signal having a carrier with upper and lower sidebands imposed thereon;

filtering the electrical signal to produce a first processed electrical signal, said signal having an upconverted lower sideband;

modulating a second portion of the first output optical signal with the upconverted electrical signal to produce a second processed optical signal having a carrier with an upconverted lower sideband optical signal imposed thereon;

combining a second portion of the third optical signal with a first portion of the fifth optical signal to produce a combined optical signal;

converting the combined optical signal into a combined electrical signal;

mixing the combined electrical signal with a predetermined shifting frequency from a frequency source that is applied to a phase locked loop, the output of which is applied to a third optical source to vary the frequency of the optical signal generated by the third optical source;

combining the second processed optical signal and the sixth optical signal to produce a final output optical signal;

converting the final output optical signal into an output radio frequency signal; and filtering the output radio frequency signal so that it has the same characteristics as the input radio frequency signal but with the center frequency shifted.

* * * * *